United States Patent
Ko et al.

(10) Patent No.: US 8,067,275 B2
(45) Date of Patent: Nov. 29, 2011

(54) INTEGRATED CIRCUIT PACKAGE SYSTEM WITH PACKAGE INTEGRATION

(75) Inventors: WonJun Ko, Sungnam-Si (KR); Jong Wook Ju, Icheon-Si (KR); SeungYong Chai, Ichon-si (KR); Taeg Ki Lim, Icheon (KR); Ja Eun Yun, Busan (KR)

(73) Assignee: Stats Chippac Ltd., Singapore (SG)

( * ) Notice: Subject to any disclaimer, the term of this patent is extended or adjusted under 35 U.S.C. 154(b) by 260 days.

(21) Appl. No.: 11/957,845

(22) Filed: Dec. 17, 2007

(65) Prior Publication Data

US 2009/0155961 A1 Jun. 18, 2009

(51) Int. Cl.
*H01L 21/00* (2006.01)
*H01L 23/28* (2006.01)

(52) U.S. Cl. .................................. 438/127; 257/787

(58) Field of Classification Search .................. 438/109, 438/125–127
See application file for complete search history.

(56) References Cited

U.S. PATENT DOCUMENTS

| | | | |
|---|---|---|---|
| 7,199,465 B2 | 4/2007 | Lim | |
| 2004/0113253 A1* | 6/2004 | Karnezos | 257/686 |
| 2006/0244157 A1* | 11/2006 | Carson | 257/787 |
| 2006/0267609 A1* | 11/2006 | Lee et al. | 324/754 |
| 2007/0141754 A1 | 6/2007 | Lim | |
| 2007/0246815 A1 | 10/2007 | Lu et al. | |

* cited by examiner

*Primary Examiner* — Ha Tran T. Nguyen
*Assistant Examiner* — Valerie N Brown
(74) *Attorney, Agent, or Firm* — Mikio Ishimaru

(57) ABSTRACT

An integrated circuit package system comprising: providing a base substrate; attaching a base integrated circuit die over the base substrate; forming a support over the base substrate near only one edge of the base substrate; and attaching a stack substrate over the support and the base integrated circuit die.

20 Claims, 3 Drawing Sheets

INTEGRATED CIRCUIT PACKAGE SYSTEM WITH PACKAGE INTEGRATION

TECHNICAL FIELD

The present invention relates generally to integrated circuit packages and more particularly to a system for integrated circuit packages with package-in-package.

BACKGROUND ART

Electronic products have become an integral part of our daily lives. Many electronic products with complex integrated circuits are commonly used sometimes without an end user even realizing that there is underlying electronic technology. Even for products that include obvious electronic technology such as cell phones, music players, televisions, or automobiles, the technology itself is not well understood.

With virtually all electronic products, there has been a consistent if not increasing demand for new features, higher speed, more data, improved portability, etc. These demands have driven the development of electronic technology including reducing size, improving utility, or increasing performance of the integrated circuit devices contained within an ever-increasing range of electronic products.

There has been constant pressure within the semiconductor industry to reduce dimensional footprints as well as increase quality, reliability, and performance fueled by consumer demands for smaller, higher quality electronic products that operate faster, with more information, as well as more reliably under broader and sometimes more severe operating conditions and environments.

The integrated circuits are commonly assembled into integrated circuit packages for protection and interconnection to other integrated circuits, integrated circuit packages, printed circuit boards, other subsystems, or systems. The development of integrated circuit packages requires not only compatibility with a wide range of integrated circuits but must also provide integration or combinations not available in a single integrated circuit device.

Many electronic products have taken advantage of including multiple integrated circuit devices or integrated circuit packages within a stacked integrated circuit package. The stacked integrated circuit package provides overall protection from operating conditions, intraconnection between components, and interconnection to a next level subsystem. Using known good components can reduce defects lowering overall costs of the integrated circuit package.

While stacking integrated circuits within integrated circuit packages has improved dimensional densities and footprints it has not been without problems. Integrated circuit and integrated circuit package component dimensions have been limited and restricted by manufacturing methods and equipment. Smaller and more varied components are very susceptible to damage during processing.

Attempts to combine a variety of integrated circuit devices have significantly affected manufacturing costs or working product yields. Damage or often time's breakage can render inoperable a component such as a substrate, interposer, or integrated circuit. The damage or breakage typically occurs during processing when some of the components are being assembled or connected.

Other attempts to prevent damage have included support features between components with significant spaces between them. These configurations describe at least one, or one or more supports but actually depict multiple supports particularly on opposite ends of a component to protect other components mounted centrally. These attempts significantly limit the range of devices that can be combined in a package.

The combinations have been limited to a subset of a broad spectrum of integrated circuit types as well as sizes. Combining these different integrated circuits has also been limited by the wide variety of interconnections, specifications, or interactions resulting in significant limitations and challenges for small, cost-effective packaging.

Despite the advantages of recent developments in integrated circuit and integrated circuit package manufacturing, there is a continuing need for improving integrated circuit device and integrated circuit package connectivity and stacking to provide improved dimensional size of available space and as well as structural integrity, manufacturing yield, and product reliability.

Thus, a need still remains for an integrated circuit package system to provide improved package-in-package stacking integration. In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a base substrate; attaching a base integrated circuit die over the base substrate; forming a support over the base substrate near only one edge of the base substrate; and attaching a stack substrate over the support and the base integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
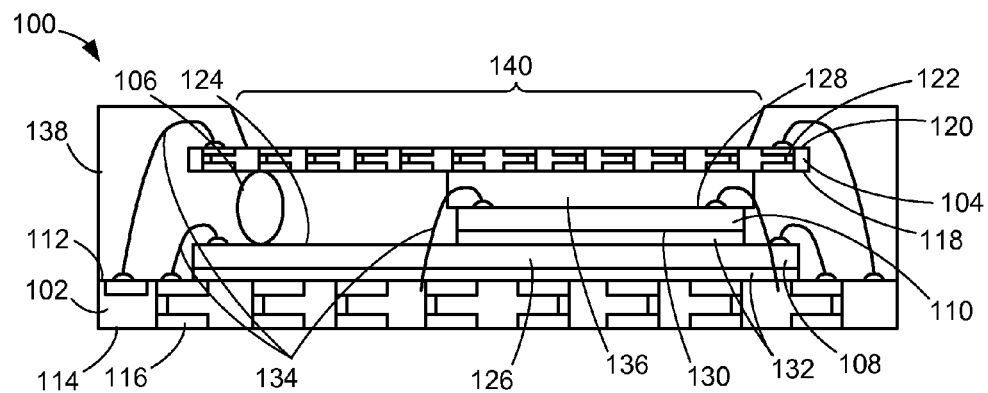
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
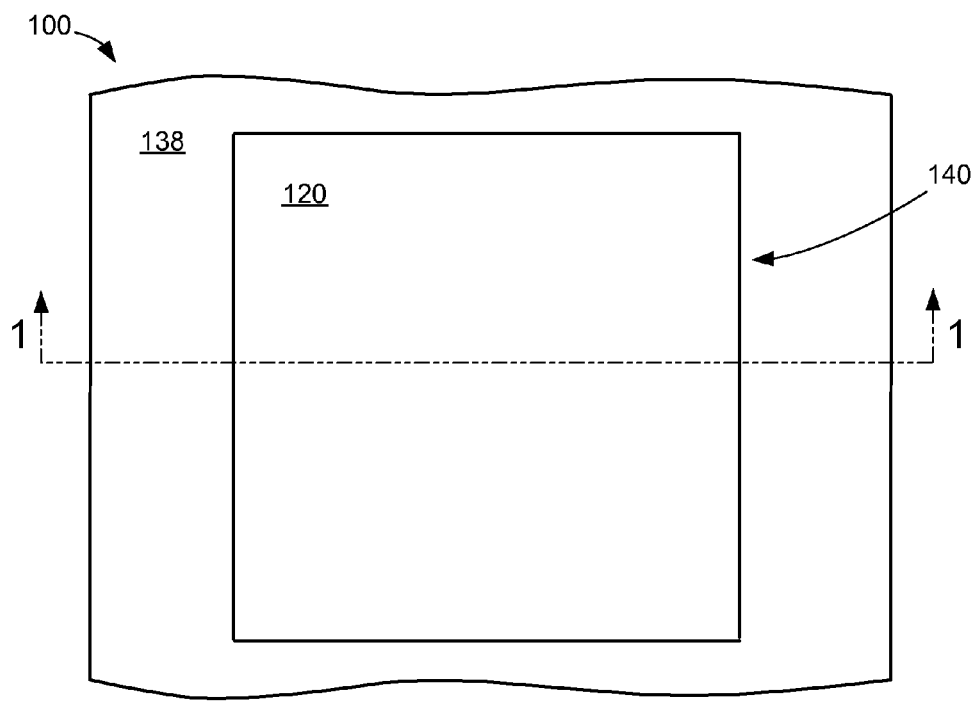
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a base substrate 102, a stack substrate 104, support 106 such as polymer or epoxy dots, and a base integrated circuit die 108, a stack integrated circuit die 110.

The base substrate 102 can include a base internal surface 112 and a base external surface 114. The base internal surface 112 can provide a mounting surface for stack components such as the base integrated circuit die 108 or a connection surface for stack components such as the base integrated circuit die 108 or the stack integrated circuit die 110. The base external surface 114 can provide a connectivity surface for another component or a next level system.

The base internal surface 112 and the base external surface 114 can be electrically connected with base substrate connections 116. The base substrate connections 116 can provide connectivity and routing of electrical signals or electrical levels in the base substrate 102. The base substrate connections 116 can also provide connection surfaces substantially coplanar to a plane of the base internal surface 112 or a plane of the base external surface 114.

Similarly, the stack substrate 104 can include a stack internal surface 118 and a stack external surface 120. The stack internal surface 118 provides a connection surface for stack components such as the stack integrated circuit die 110. The stack external surface 120 provides a connectivity surface for another component or a next level system. The stack external surface 120 can be partially exposed providing stacking such as in a Fan-in Package-on-Package.

The stack internal surface 118 and the stack external surface 120 can be electrically connected with stack substrate connections 122. The stack substrate connections 122 can provide connectivity and routing of electrical signals or electrical levels through the stack substrate 104. The stack substrate connections 122 can also provide connection surfaces substantially coplanar to a plane of the stack internal surface 118 or a plane of the stack external surface 120.

The base integrated circuit die 108 can include a base die connect surface 124 such as an active side and a base die mount surface 126 such as a back side. The base die connect surface 124 can include connection pads such as bond wire pads for electrically connecting integrated circuits with a next level system such as a package.

The base die mount surface 126 can provide a surface for mounting the base integrated circuit die 108 over a next level system such as a package. The base die mount surface 126 can optionally provide a surface without active circuitry or a connection to an electrical level such as ground.

In a similar manner, the stack integrated circuit die 110 can include a stack die connect surface 128 such as an active side and a stack die mount surface 130 such as a back side. The stack die connect surface 128 can include connection pads such as bond wire pads for electrically connecting integrated circuits with a next level system such as a package.

The stack die mount surface 130 can provide a surface for mounting the stack integrated circuit die 110 over a next level system such as a package. The stack die mount surface 130 can optionally provide a surface without active circuitry or a connection to an electrical level such as ground.

A die attach layer 132 such as an adhesive, a film, an epoxy, or combination thereof, can be applied to attach or mount the base integrated circuit die 108 over the base substrate 102 or the stack integrated circuit die 110 over the base integrated circuit die 108. One of the die attach layer 132 can be formed of the same or different material as another of the die attach layer 132 in the present invention.

Electrical connectors 134 such as bond wires, solder, planar interconnect, tab bonds, or combination thereof, can connect the base integrated circuit die 108, the stack integrated circuit die 110, the base substrate 102, or the stack substrate 104. The electrical connectors 134 can preferably provide connectivity for electrical signals or electrical levels between one component and another component.

A spacer layer 136 can be applied to provide structural integrity or substantially fixed locations for components such as the stack integrated circuit die 110 or a portion of the stack substrate 104. The spacer layer 136 can optionally provide spacing for components predetermined to provide a component such as the stack substrate 104 substantially parallel to another component such as the base integrated circuit die 108. The spacer layer 136 can encase a portion of the electrical connectors 134 that are connected to the stack integrated circuit die 110. The spacer layer 136 can overhang above the stack integrated circuit die 110 at both peripheries of the stack integrated circuit die 110 as seen in FIG. 1.

The support 106 and the spacer layer 136 allow the base integrated circuit die 108 or the stack integrated circuit die 110 to be mounted having an offset from a center portion of the base substrate 102. The support 106 can preferably be applied near only one edge of the base integrated circuit die 108 or the base substrate 102 providing additional space for stacking components such as the stack integrated circuit die 110.

The support 106 can optionally be formed as a sole row having two or more dots. The dots can be formed in a substantially straight line to provide support for a sole edge of the stack substrate 104. The support 106 can also optionally be formed as a sole elongated shape. The elongated shape can be formed having a length significantly longer than a width to provide support for a sole edge of the stack substrate 104.

A row axis substantially through the centers of a sole line of the support 106 formed as dots can be near, such as closer to one than another of, a parallel edge of the base integrated circuit die 108 or the base substrate 102. A shape axis substantially parallel to the longer length of the support 106 formed as the elongated shape can be near, such as closer to one than another of, a parallel edge of the base integrated circuit die 108 or the base substrate 102.

For example, the support 106 can be formed with a process such as a pre dotting process wherein the support 106 is formed over the base die mount surface 126 of the base integrated circuit die 108 without the stack substrate 104. The support 106 can be formed in a shape of an ovoid resulting from a dotting process and characteristics of materials used to form the support 106.

Further to the example, the stack substrate 104 can be mounted over, or optionally on, the support 106 providing a predetermined spacing between the base internal surface 112 of the base substrate 102 and the stack internal surface 118 of the stack substrate 104. The predetermined spacing can support the stack substrate 104 having the stack internal surface 118 substantially parallel to the base internal surface 112 of the base substrate 102.

An encapsulant 138 can be applied over the base substrate 102, the base integrated circuit die 108, the stack integrated circuit die 110, and the stack substrate 104. The encapsulant 138 can be formed providing a portion of the stack external surface 120 substantially exposed. The substantially exposed portion of the stack external surface 120 can provide a mounting surface for additional components.

The encapsulant 138 can optionally be formed having tapered sides adjacent the stack external surface 120. An opening 140 in the encapsulant 138 can be formed having a width near the stack external surface 120 smaller than a width near an outer extent of the encapsulant 138 providing a mounting region such as a fan-in cavity for a component such as a fan-in internal-stack-module.

It has been discovered that the integrated circuit package system 100 with the support 106 formed near one edge of the integrated circuit package system 100, provides structural integrity and a substantially fixed position for stacked components such as the stack substrate 104 over centered or offset components such as the stack integrated circuit die 110 or the base integrated circuit die 108.

Referring now to FIG. 2 therein is shown a top plan view of the integrated circuit package system 100. The integrated circuit package system 100 preferably includes the encapsulant 138, the opening 140, and the stack external surface 120. The support 106 of FIG. 1 can provide the stack external surface 120 substantially parallel to a plane of an outer top extent of the encapsulant 138.

The opening 140 and the stack external surface 120 can provide a mounting region for other components such as a package, an integrated circuit die, a passive device, or other internal stacking module. For illustrative purposes, the opening 140 is shown in a shape of a rectangle having a substantially square shape although it is understood that the opening 140 may be of any shape or size.

Figure 3:
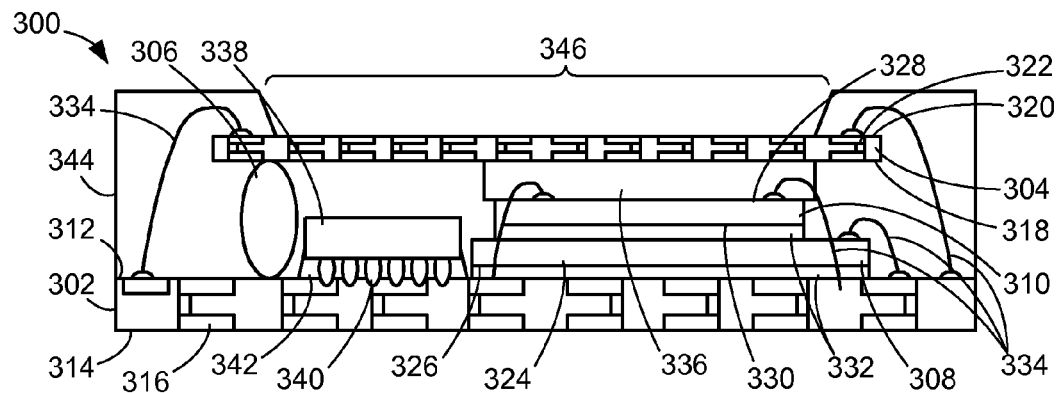
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a base substrate 302, a stack substrate 304, support 306 such as polymer or epoxy dots, and a base integrated circuit die 308, a stack integrated circuit die 310.

The base substrate 302 can include a base internal surface 312 and a base external surface 314. The base internal surface 312 can provide a mounting surface for stack components such as the base integrated circuit die 308 or a connection surface for stack components such as the base integrated circuit die 308 or the stack integrated circuit die 310. The base external surface 314 can provide a connectivity surface for another component or a next level system.

The base internal surface 312 and the base external surface 314 can be electrically connected with base substrate connections 316. The base substrate connections 316 can provide connectivity and routing of electrical signals or electrical levels in the base substrate 302. The base substrate connections 316 can also provide connection surfaces substantially coplanar to a plane of the base internal surface 312 or a plane of the base external surface 314.

Similarly, the stack substrate 304 can include a stack internal surface 318 and a stack external surface 320. The stack internal surface 318 provides a connection surface for stack components such as the stack integrated circuit die 310. The stack external surface 320 provides a connectivity surface for another component or a next level system. The stack external surface 320 can be partially exposed providing stacking such as in a Fan-in Package-on-Package.

The stack internal surface 318 and the stack external surface 320 can be electrically connected with stack substrate connections 322. The stack substrate connections 322 can provide connectivity and routing of electrical signals or electrical levels through the stack substrate 304. The stack substrate connections 322 can also provide connection surfaces substantially coplanar to a plane of the stack internal surface 318 or a plane of the stack external surface 320.

The base integrated circuit die 308 can include a base die connect surface 324 such as an active side and a base die mount surface 326 such as a back side. The base die connect surface 324 can include connection pads such as bond wire pads for electrically connecting integrated circuits with a next level system such as a package.

The base die mount surface 326 can provide a surface for mounting the base integrated circuit die 308 over a next level system such as a package. The base die mount surface 326 can optionally provide a surface without active circuitry or a connection to an electrical level such as ground.

In a similar manner, the stack integrated circuit die 310 can include a stack die connect surface 328 such as an active side and a stack die mount surface 330 such as a back side. The stack die connect surface 328 can include connection pads such as bond wire pads for electrically connecting integrated circuits with a next level system such as a package.

The stack die mount surface 330 can provide a surface for mounting the stack integrated circuit die 310 over a next level system such as a package. The stack die mount surface 330 can optionally provide a surface without active circuitry or a connection to an electrical level such as ground.

A die attach layer 332 such as an adhesive, a film, an epoxy, or combination thereof, can be applied to attach or mount the base integrated circuit die 308 over the base substrate 302 or the stack integrated circuit die 310 over the base integrated circuit die 308. One of the die attach layer 332 can be formed of the same or different material as another of the die attach layer 332 in the present invention.

Electrical connectors 334 such as bond wires, solder, planar interconnect, tab bonds, or combination thereof, can connect the base integrated circuit die 308, the stack integrated circuit die 310, the base substrate 302, or the stack substrate 304. The electrical connectors 334 can preferably provide connectivity for electrical signals or electrical levels between one component and another component.

A spacer layer 336 can be applied to provide structural integrity or substantially fixed locations for components such as the stack integrated circuit die 310 or a portion of the stack substrate 304. The spacer layer 336 can optionally provide spacing for components predetermined to provide a component such as the stack substrate 304 substantially parallel to another component such as the base integrated circuit die 308.

The spacer layer 336 can also provide spacing for a base device 338. The base device 338 can include base device connectors 340 such as solder bumps over the base substrate 302. A base fill layer 342 can optionally be applied between the base substrate 302 and the base device 338 for structural integrity, a substantially fixed position, or spacing. The base fill layer 342 can preferably be formed of a non-conductive material that can be conformal or non-conformal.

For illustrative purposes, the base device 338 is shown as a flip chip or a ball grid package although it is understood that the device 338 may be any component. The base device connectors 340 can electrically connect the base device 338 and the base substrate 302. The base device 338 can preferably be attached or mounted adjacent the base integrated circuit die 308 and the support 306.

The support 306 and the spacer layer 336 allow the base integrated circuit die 308 or the stack integrated circuit die 310 to be mounted having an offset from a center portion of the base substrate 302. The support 306 can preferably be applied near only one edge of the base integrated circuit die 308 or the base substrate 302 providing additional space for stacking components such as the stack integrated circuit die 310.

The support 306 can optionally be formed as a sole row having two or more dots. The dots can be formed in a substantially straight line to provide support for a sole edge of the stack substrate 304. The support 306 can also optionally be formed as a sole elongated shape. The elongated shape can be formed having a length significantly longer than a width to provide support for a sole edge of the stack substrate 304.

A row axis substantially through the centers of a sole line of the support 306 formed as dots can be near, such as closer to one than another of, a parallel edge of the base integrated circuit die 308 or the base substrate 302. A shape axis substantially parallel to the longer length of the support 306 formed as the elongated shape can be near, such as closer to one than another of, a parallel edge of the base integrated circuit die 308 or the base substrate 302.

For example, the support 306 can be formed with a process such as a pre dotting process wherein the support 306 is formed over the base internal surface 312 of the base substrate 302 without the stack substrate 304. The support 306 can be formed in a shape of an ovoid resulting from a dotting process and characteristics of materials used to form the support 306.

Further to the example, the stack substrate 304 can be mounted over, or optionally on, the support 306 providing a predetermined spacing between the base internal surface 312 of the base substrate 302 and the stack internal surface 318 of the stack substrate 304. The predetermined spacing can support the stack substrate 304 having the stack internal surface 318 substantially parallel to the base internal surface 312 of the base substrate 302.

An encapsulant 344 can be applied over the base substrate 302, the base integrated circuit die 308, the stack integrated circuit die 310, and the stack substrate 304. The encapsulant 344 can be formed providing a portion of the stack external surface 320 substantially exposed. The substantially exposed portion of the stack external surface 320 can provide a mounting surface for additional components.

The encapsulant 344 can optionally be formed having tapered sides adjacent the stack external surface 320. An opening 346 in the encapsulant 342 can be formed having a width near the stack external surface 320 smaller than a width near an outer extent of the encapsulant 344 providing a mounting region such as a fan-in cavity for a component such as a fan-in internal-stack-module.

Figure 4:
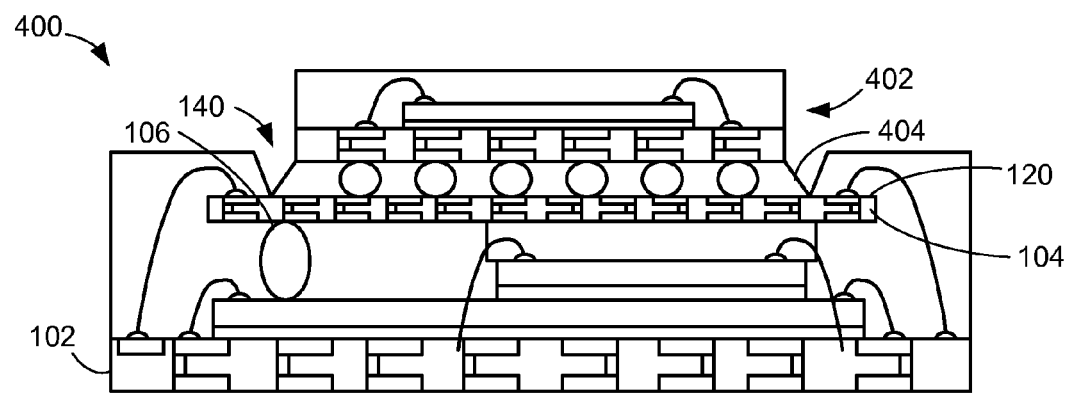
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes the structure as shown in FIG. 1 having the base substrate 102, the stack substrate 104, and the support 106. A device 402 can be mounted partially in the opening 140 and over the stack external surface 120 of the stack substrate 104.

A top fill layer 404 can optionally be formed under the device 402 providing structural integrity, a substantially fixed position, or spacing. The top fill layer 404 can be formed of a non-conductive material that can be conformal or non-conformal. For illustrative purposes, the device 402 is shown as a ball grid package although it is understood that the device 402 may be any component.

Figure 5:
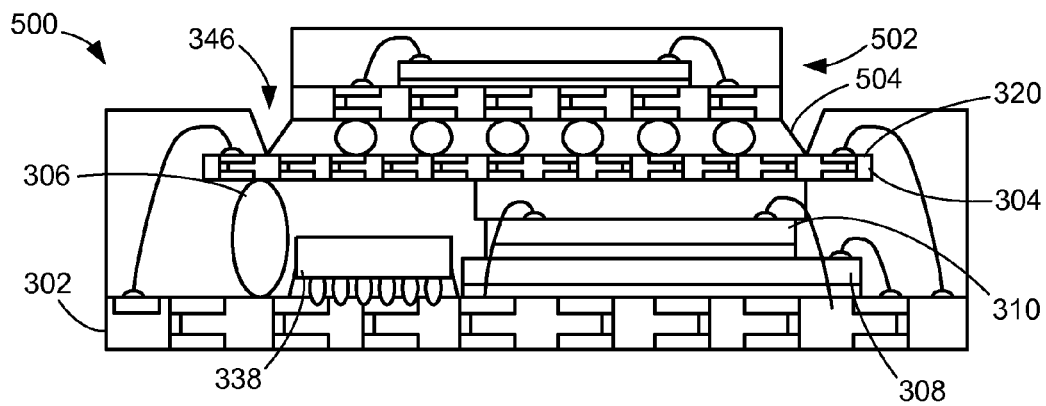
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes the structure as shown in FIG. 3 having the base substrate 302, the stack substrate 304, and the support 306. The base integrated circuit die 308, the stack integrated circuit die 310, and the base device 338 can be mounted over the substrate 302 adjacent the support 306.

A device 502 can be mounted partially in the opening 344 and over the stack external surface 320 of the stack substrate 304. A top fill layer 504 can optionally be formed under the device 502 providing structural integrity, a substantially fixed position, or spacing. The top fill layer 504 can be formed of a non-conductive material that can be conformal or non-conformal. For illustrative purposes, the device 502 is shown as a ball grid package although it is understood that the device 502 may be any component.

Figure 6:
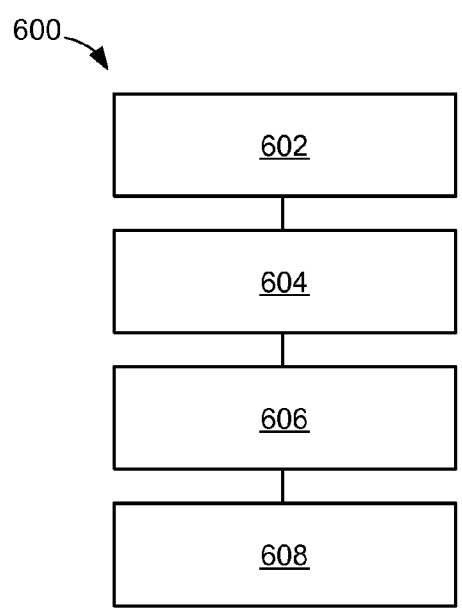
FIG. 6 is a flow chart of an integrated circuit package system for manufacturing the integrated circuit package system in an embodiment of the present invention.

Referring now to FIG. 6, therein is shown a flow chart of an integrated circuit package system 600 for manufacturing the integrated circuit package system 100 in an embodiment of the present invention. The system 600 includes providing a base substrate in a block 602; attaching a base integrated circuit die over the base substrate in a block 604; forming a support over the base substrate near only one edge of the base substrate in a block 606; and attaching a stack substrate over the support and the base integrated circuit die in a block 608.

In greater detail, a system to provide the method and apparatus of the integrated circuit package system 100, in an embodiment of the present invention, is performed as follows:

1. Providing a base substrate having a base internal surface.
2. Attaching a base integrated circuit die over the base internal surface.
3. Forming a support over the base internal surface near only one edge of the base internal surface.

4. Attaching a stack substrate having a stack external surface and a stack internal surface over the support and the base integrated circuit die.

5. Applying an encapsulant having an opening over the stack external surface.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a base substrate;
   attaching a base integrated circuit die over the base substrate;
   attaching a stack integrated circuit die over the base integrated circuit die;
   attaching a spacer layer over the stack integrated circuit die with a portion of the spacer layer overhanging over a periphery of the stack integrated circuit die;
   forming a support having a shape of an ovoid over the base substrate and adjacent only one edge of the base substrate; and
   attaching a stack substrate over the support and the spacer layer.

2. The method as claimed in claim 1 further comprising attaching an electrical connector between the base substrate and the stack integrated circuit die with the electrical connector partially encased within the spacer layer.

3. The method as claimed in claim 1 wherein attaching the stack substrate includes attaching the stack substrate over the spacer layer formed over a portion of the base integrated circuit die.

4. The method as claimed in claim 1 wherein forming the support includes dotting a sole row of the support over the base substrate.

5. The method as claimed in claim 1 wherein forming the support includes forming a sole elongated shape over the base substrate.

6. A method for manufacturing an integrated circuit package system comprising:
   providing a base substrate having a base internal surface;
   attaching a base integrated circuit die over the base internal surface;
   attaching a stack integrated circuit die over the base integrated circuit die;
   attaching a spacer layer over the stack integrated circuit die with a portion of the spacer layer overhanging over a periphery of the stack integrated circuit die;
   forming a support having a shape of an ovoid over the base substrate and adjacent only one edge of the base substrate;
   attaching a stack substrate having a stack external surface and a stack internal surface over the support and the spacer layer; and
   applying an encapsulant having an opening over the stack external surface.

7. The method as claimed in claim 6 further comprising attaching a device over the stack external surface and partially within the opening.

8. The method as claimed in claim 6 wherein forming the support includes forming the support on the base integrated circuit die.

9. The method as claimed in claim 6 wherein forming the support includes forming the support on the base substrate.

10. The method as claimed in claim 6 further comprising attaching a device over the base substrate adjacent the support or the base integrated circuit die.

11. An integrated circuit package system comprising:
    a base substrate;
    a base integrated circuit die over the base substrate;
    a stacked integrated circuit die over the base integrated circuit die;
    a spacer layer over the stack integrated circuit die with a portion of the spacer layer overhanging a periphery of the stack integrated circuit die;
    a support having a shape of an ovoid over the base substrate and adjacent only one edge of the base substrate; and
    a stack substrate over the support and the spacer layer.

12. The system as claimed in claim 11 further comprising an electrical connector attached between the base substrate and the stack integrated circuit die with the electrical connector partially encased within the spacer layer.

13. The system as claimed in claim 11 wherein the stack substrate is over the spacer layer formed over a portion of the base integrated circuit die.

14. The system as claimed in claim 11 wherein the support is a sole row dotted over the base substrate.

15. The system as claimed in claim 11 wherein the support is a sole elongated shape over the base substrate.

16. The system as claimed in claim 11 wherein:
    the base substrate has a base internal surface;
    the base integrated circuit die is over the base internal surface;
    the support is over the base internal surface near only one edge of the base substrate;
    the stack substrate has a stack external surface and a stack internal surface over the support and the base integrated circuit die; and
    further comprising:
    an encapsulant having an opening over the stack external surface.

17. The system as claimed in claim 16 further comprising a device over the stack external surface and partially within the opening.

18. The system as claimed in claim 16 wherein the support is on the base integrated circuit die.

19. The system as claimed in claim 16 wherein the support is on the base substrate.

20. The system as claimed in claim 16 further comprising a device over the base substrate adjacent the support or the base integrated circuit die.

* * * * *